US010574245B2

(12) United States Patent
Zhang

(10) Patent No.: US 10,574,245 B2
(45) Date of Patent: Feb. 25, 2020

(54) DIGITALLY CONTROLLED OSCILLATOR FOR A MILLIMETER WAVE SEMICONDUCTOR DEVICE

(71) Applicant: GLOBALFOUNDRIES INC., Grand Cayman (KY)

(72) Inventor: Chi Zhang, Allen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 88 days.

(21) Appl. No.: 15/979,263

(22) Filed: May 14, 2018

(65) Prior Publication Data

US 2019/0296751 A1 Sep. 26, 2019

Related U.S. Application Data

(60) Provisional application No. 62/646,315, filed on Mar. 21, 2018.

(51) Int. Cl.
| | | |
|---|---|---|
| *H03L 7/099* | (2006.01) | |
| *H01L 27/06* | (2006.01) | |
| *H03B 5/12* | (2006.01) | |
| *H03L 7/093* | (2006.01) | |

(52) U.S. Cl.
CPC ........ *H03L 7/0991* (2013.01); *H01L 27/0629* (2013.01); *H03B 5/1228* (2013.01); *H03B 5/1265* (2013.01); *H03L 7/093* (2013.01); *H03L 2207/50* (2013.01)

(58) Field of Classification Search
CPC ... H03L 7/0991; H03L 7/093; H01L 27/0629; H03B 5/1228; H03B 5/1265
See application file for complete search history.

(56) References Cited

U.S. PATENT DOCUMENTS

| 7,915,968 | B2 | 3/2011 | Kim et al. |
| 8,902,009 | B1 | 12/2014 | De Bernardinis et al. |
| 9,093,950 | B2* | 7/2015 | Ashckenazi ......... H03B 5/1228 |
| 2006/0055470 | A1 | 3/2006 | Luong et al. |
| 2006/0071731 | A1* | 4/2006 | Tateyama ................. H03B 5/04 |
| | | | 331/158 |
| 2009/0302958 | A1 | 12/2009 | Sakurai et al. |
| 2014/0085012 | A1 | 3/2014 | Wu et al. |
| 2016/0156315 | A1* | 6/2016 | Nasu ....................... H03F 3/191 |
| | | | 330/296 |

* cited by examiner

*Primary Examiner* — Jeffrey M Shin
(74) *Attorney, Agent, or Firm* — Williams Mogan, P.C.

(57) ABSTRACT

A digitally controlled oscillator (DCO) may include a transformer, which may contain a secondary winding comprising a first port, a second port, and an array of capacitor units, wherein each capacitor unit includes a first NFET having a gate and a back gate connected to a control signal, and a drain connected to the first port; a second NFET having a gate connected to ground, a back gate connected to the control signal, and a drain connected to the source of the first NFET; and a third NFET having a gate and a back gate connected to the control signal, a drain connected to the source of the second NFET, and a source connected to the second port. The capacitor units may allow fine tuning of the DCO output frequency with a resolution of about 0.3 MHz and a range of about 80 MHz.

20 Claims, 9 Drawing Sheets

$$L_{eq}|_{R_L=\infty} = L_P\left(1 + k^2 \frac{\omega^2 L_S C_L}{1 - \omega^2 L_S C_L}\right)$$

DIGITALLY CONTROLLED OSCILLATOR FOR A MILLIMETER WAVE SEMICONDUCTOR DEVICE

BACKGROUND OF THE INVENTION

Field of the Invention

Generally, the present disclosure relates to sophisticated semiconductor devices and, more specifically, to a digitally controlled oscillator for mm-wave semiconductor devices.

Description of the Related Art

Semiconductor devices that involve mm-wave applications include devices that operate based on the electromagnetic spectrum of radio band frequencies in the range of about 30 GigaHertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave devices include radar devices, high-speed communication devices (e.g., wireless gigabit (WiGig) devices,), etc. Radar devices have been implemented in various applications such as vehicle safety and automation applications.

State of the art mm-wave devices generally suffer from various problems with regard to oscillators. For example, state of the art systems that involve radar and communications applications of mm-wave devices generally have problems with configuring digitally controlled oscillators (DCOs) to have wide frequency tuning range, while at the same time have high or fine frequency tuning resolution. Further, state of the art oscillators generally show characteristics of excessive phase noise and power consumption.

The present disclosure may address and/or at least reduce one or more of the problems identified above regarding the prior art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to capacitor units and a digitally controlled oscillator (DCO) including such capacitor units. Such capacitor units may allow fine tuning of DCO output frequencies with a wide fine tuning range, low phase noise, and low power consumption.

In one embodiment, the present disclosure relates to a DCO comprising: a transformer, comprising: a secondary winding comprising a first port, a second port, and an array of capacitor units, wherein each capacitor unit comprises: a first NFET having a gate and a back gate connected to a control signal, and a drain connected to the first port of the secondary winding; a second NFET having a gate connected to ground, a back gate connected to the control signal, and a drain connected to the source of the first NFET; and a third NFET having a gate and a back gate connected to the control signal, a drain connected to the source of the second NFET, and a source connected to the second port of the secondary winding.

In one embodiment, the present disclosure relates to a capacitor unit, comprising: a first NFET having a gate and a back gate connected to a control signal, and a drain connected to a first voltage source; a second NFET having a gate connected to ground, a back gate connected to the control signal, and a drain connected to the source of the first NFET; and a third NFET having a gate and a back gate connected to the control signal, a drain connected to the source of the second NFET, and a source connected to a second voltage source.

In one embodiment, the present disclosure relates to a method, comprising: providing a digitally controlled oscillator (DCO) comprising a transformer, the transformer comprising a primary winding and a secondary winding, the secondary winding comprising a first port, a second port, and an array of capacitor units, wherein each capacitor unit comprises a first NFET having a gate and a back gate connected to a control signal, and a drain connected to the first port of the secondary winding; a second NFET having a gate connected to ground, a back gate connected to the control signal, and a drain connected to the source of the first NFET; and a third NFET having a gate and a back gate connected to the control signal, a drain connected to the source of the second NFET, and a source connected to the second port of the secondary winding; increasing the frequency of the DCO by a fine tuning resolution by switching on one capacitor unit; and decreasing the frequency of the DCO by the fine tuning resolution by switching off one capacitor unit.

BRIEF DESCRIPTION OF THE DRAWINGS

The disclosure may be understood by reference to the following description taken in conjunction with the accompanying drawings, in which like reference numerals identify like elements, and in which.

Figure 1:
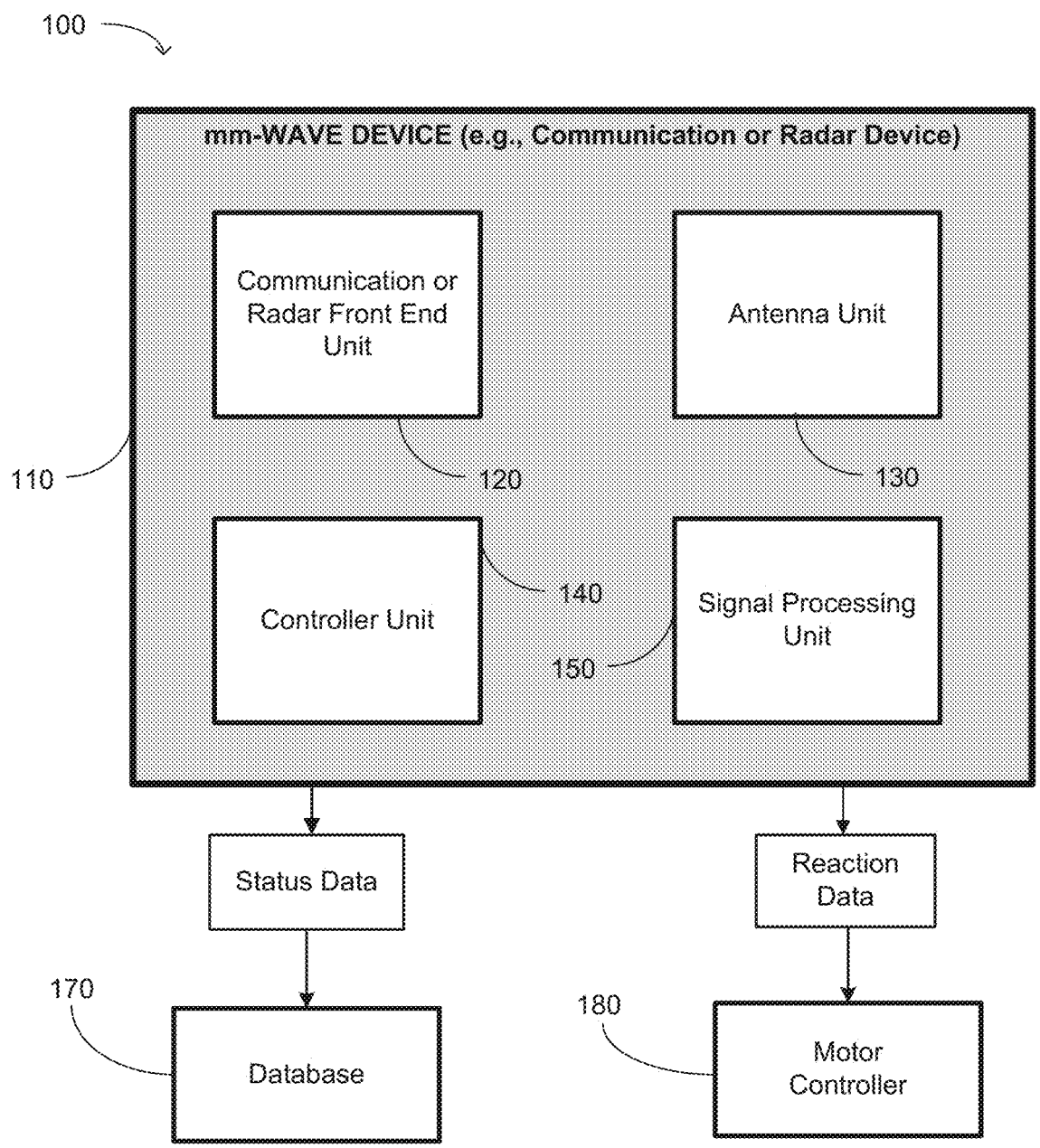
FIG. 1 illustrates a stylized block diagram representation of a radar system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for distribution of local oscillator signals to transmitters and receivers of an mm-wave system, e.g., a radar system or a communication system with low power consumption and small footprint, and without the use of Wilkinson, Gysel, or other power dividers. In one embodiment, a Wilkinson power divider may refer to a circuit that is capable of splitting an input power signal into two output power signals having equal phases. In some embodiments, a Gysel power divider may refer to a circuit that provides for splitting of an input power signal into a plurality of in-phase output power signals.

For ease of illustration, embodiments herein is depicted within the context of a radar device, however, those skilled in the art would readily appreciate that the concepts disclosed herein may be implemented in other types of devices, such as high-speed communication devices, network devices, etc. Turning now to FIG. 1, a stylized block diagram representation of a radar system, in accordance with embodiments herein, is illustrated.

A system 100 may comprise a millimeter wave (mm-wave) device 110, a database 170, and a motor controller 180. The mm-wave device 110 may be a communication device, a radar device, a data network device, a video device, or the like. For illustrative purposes and for the sake of clarity and ease of description, the mm-wave device 110 is described in the context of a communication or a radar application; as such, the mm-wave device 110 may be often referred to below as a communication or radar device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The communication or radar device 110 may be capable of transmitting a radar signal, receiving a reflected signal resultant from the reflection of the radar signal, processing the reflected signal, and providing status data and/or reaction data for performing one or more actions based on the reflected signal. In one embodiment, the status data may include status of the target from which the reflection was received. Further, a motor controller 180 may control operations of one or more motors. Examples of motors may include devices that performing braking functions, steering functions, gear-shifting functions, accelerating functions, warning functions, and/or other actions relating to the operations of a road vehicle, an aircraft, and/or a watercraft. The motor controller 180 may use the reaction data and/or the status data to perform these control functions. The motor controller 180 may comprise one or more controllers that are capable of controlling a plurality of devices that perform the various operations of a road vehicle, an aircraft, and/or a watercraft.

In another embodiment, the communication or radar device 110 is capable of transmitting a first communication or radar signal, receiving a second or radar communication signal, and processing the or radar second communication signal.

The communication or radar device 110 may comprise a communication or radar front end unit 120, an antenna unit 130, a controller unit 140, and a signal processing unit 150. The communication or radar front end unit 120 may comprise a plurality of components, circuit, and/or modules, and is capable of sending, receiving, processing, and reacting to radar signals. In one embodiment, the communication or radar device 110 may be encompassed into a single integrated circuit (IC) chip. In some embodiments, the communication or radar device 110 may be formed on a plurality of integrated circuits that are positioned on a single IC chip. In other embodiments, communication or radar device 110 may be formed on single integrated circuit, which is shrouded into an IC chip.

The communication or radar front end unit 120 is capable of providing a radar signal. In one embodiment, the frequency range of the radar signals processed by the communication or radar device 110 may be in the range of about 10 GHz to about 90 GHz. The communication or radar front end unit 120 is capable of generating a radar signal at a predetermined frequency range and directing the radar signal at a predetermined target area. The communication or radar front end unit 120 is also capable of receiving a reflected signal based on the reflection of radar signal, and processing the reflected signal to determine a plurality of characteristics, such as the direction of a target, the speed of a target, the relative distance of a target, and/or the like. A more detailed description of the communication or radar front end unit 120 is provided in FIG. 3 and accompanying description below.

In an alternative embodiment, the 120 may be a network communications front end unit, instead of a radar front end unit. In this embodiment, instead of receiving, transmitting, and/or processing radar signals, the device 110 may process network communications for various types of communication applications, such as packet data network communications, wireless (e.g., cellular communications, IEEE 802.11ad WiGig Technology, etc.), data communications, etc. The concepts disclosed herein in the context of radar applications may also be utilized for other types of applications, such as network communications, wireless communications, high-definition video applications, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the radar signal, while the receiver antennas are used for receiving reflected signals resulting from reflections of the radar signal. A more detailed description of the antenna unit 130 is provided in FIG. 7, and accompanying description below.

Continuing referring to FIG. 1, the communication or radar device 110 may also comprise a signal processing unit 150. The signal processing unit is capable of performing various analog and/or digital processing of the signals that are transmitted and/or received by the communication or radar device 110. For example, the radar signal transmitted by the radar device may be amplified prior to its transmission. Further, the reflected signal received by the communication or radar device 110 may be sent through one or more analog filter stages. The reflected signals may then be converted/digitized into a digital signal by one or more analog-to-digital converters (A/D converters) in the signal processing unit 150. Digital signal processing (DSP) may be performed on the digitized signal. A more detailed description of the signal processing unit 150 is provided in FIG. 6 and accompanying description below.

Continuing referring to FIG. 1, the radar device 100 may also comprise a controller unit 140. The controller unit 140 may perform various control operations of the communication or radar device 110. These functions include generating a radar signal, transmitting the radar signal, receiving a reflected signal, processing the reflected signal, and perform one or more determinations of the location, direction, speed, or other parameters of a target based on the reflected signal. The controller unit 140 is capable of generating the status data and the reaction data described above.

Figure 2:
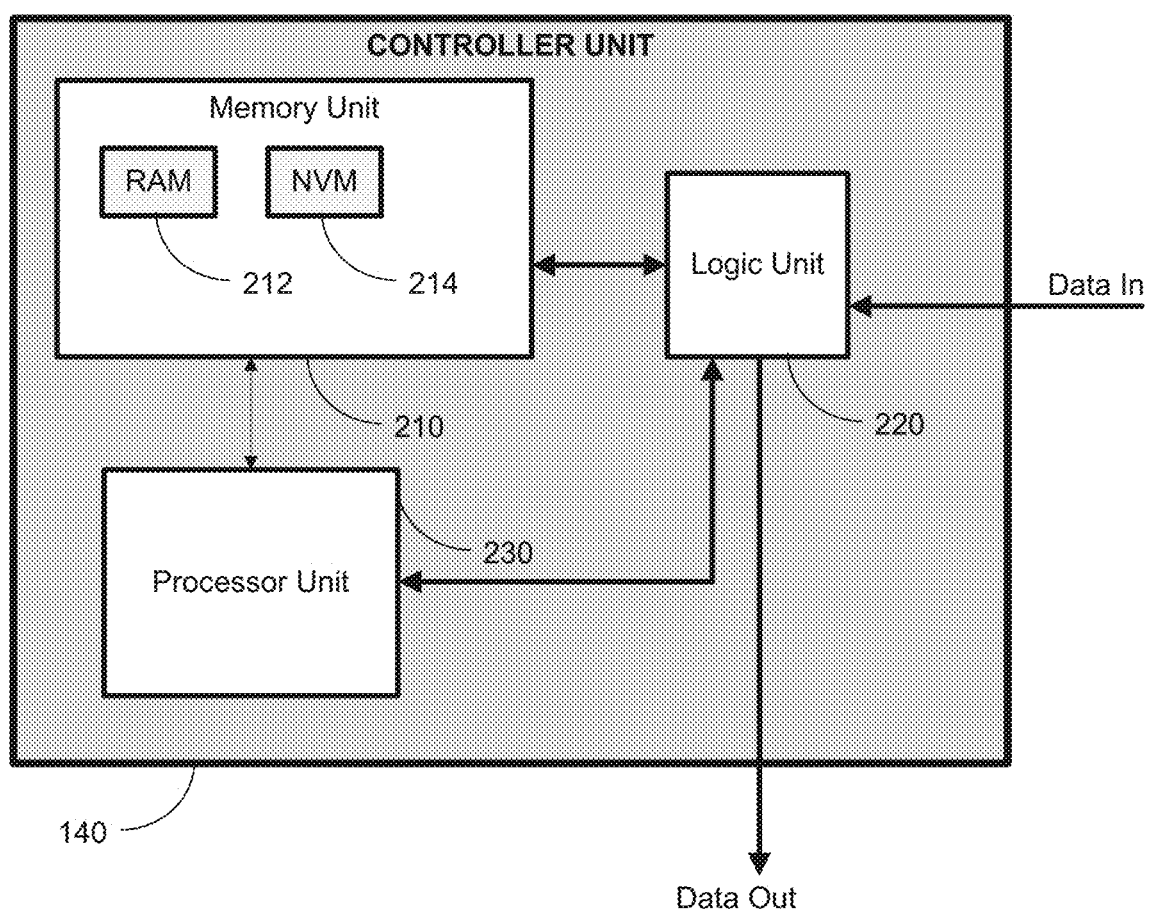
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the communication or radar device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal, data_in, may represent data derived from processing and analyzing the reflected signal. The signal, data_out, may represent data generated for performing one or more tasks as a result of the radar signal transmission and the reflected signal. For example, the data_out signal may be used to perform an action (e.g., braking, steering, accelerating, providing warnings, etc.) based on the radar signal transmission and reflected signal reception.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters, program files, etc., for controlling various operations of the communication or radar device 110. Further, the memory unit 210 may store the status data and the reaction data described above. The memory unit 210 may also store data that may be used to program any FPGA devices in the communication or radar device 110. As such, the memory unit 210 may be subdivided into a program data memory, a status data memory, and a reaction data memory. This subdivision may be performed logically, physically, or based on both, logical and physical subdivisions.

Figure 3:
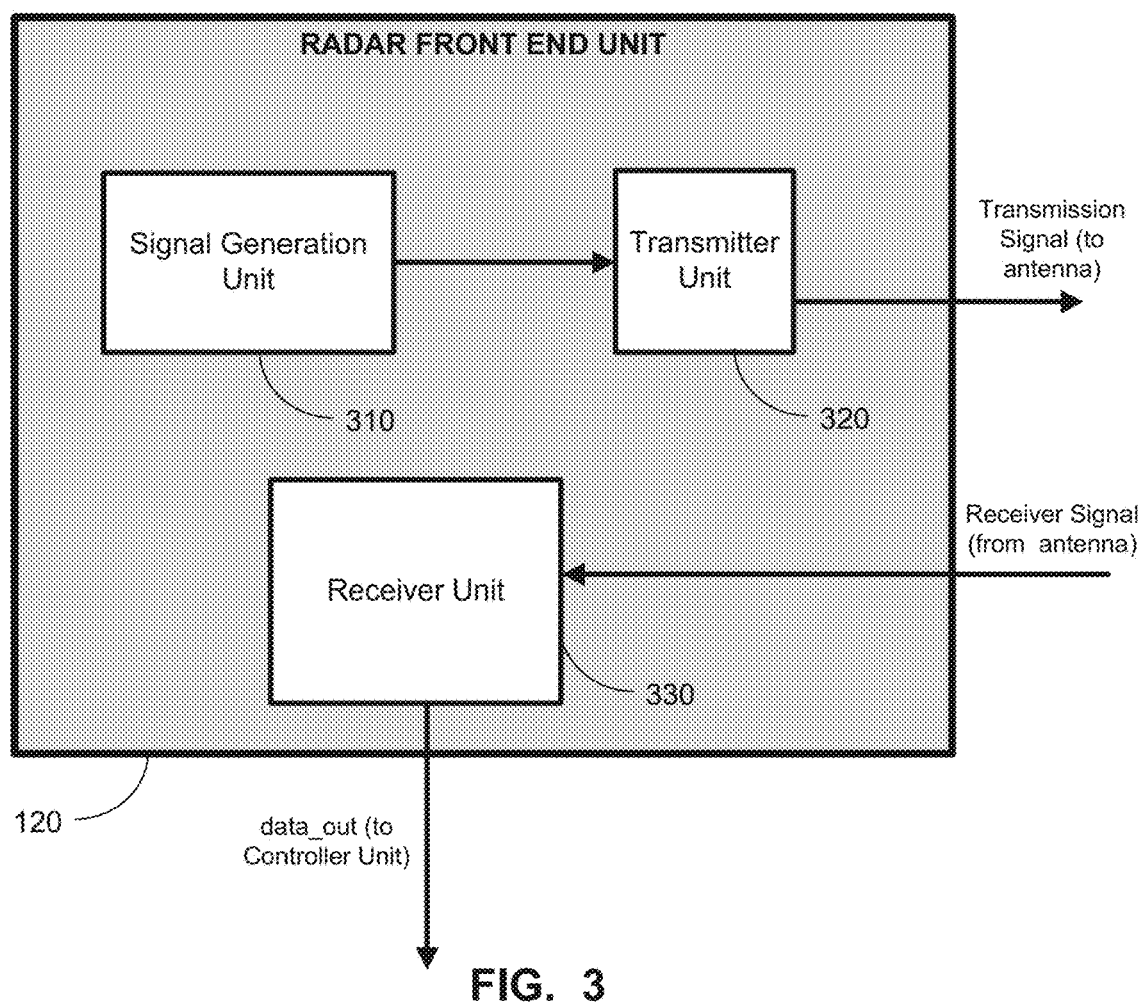
FIG. 3 illustrates a stylized block diagram depiction of the radar front end unit of FIG. 1, in accordance with embodiments herein, is illustrated.

Turning now to FIG. 3, a stylized block diagram depiction of the communication or radar front end unit 120, in accordance with embodiments herein, is illustrated. The communication or radar front end unit 120 may comprise a signal generation unit 310, a transmitter unit 320, and a receiver unit 330. The signal generation unit 310 is capable of generating a radar signal at a predetermined frequency. For example, a signal in the range of about 70 GHz to about 85 GHz may be generated. The signal generation unit 310 is capable of providing a radar signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a radar signal to be transmitted to the antenna unit 130.

Figure 4:
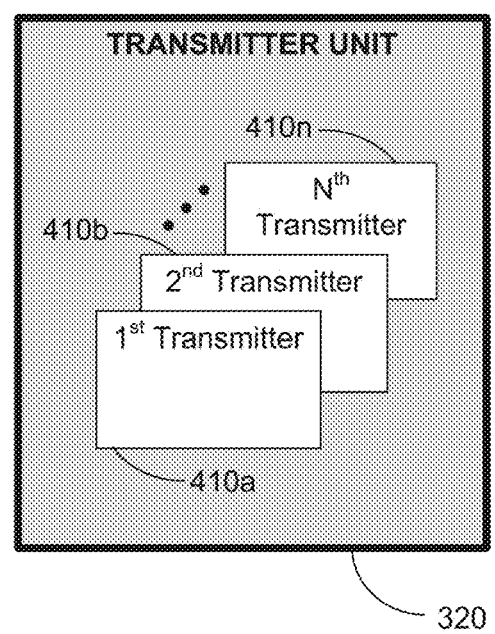
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410a, a $2^{nd}$ transmitter 410b, through an $N^{th}$ transmitter 410n (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410. For example, the signal generation unit 310 may provide a signal transmit signal for each transmitter 410, or alternatively, a $1^{st}$ transmit signal for a first set of transmitters 410 and a $2^{nd}$ transmit signal for a second set of transmitters 410.

Continuing referring to FIG. 3, a received signal (i.e., a reflected signal resulting from a reflection of the radar signal directed towards a target area) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing the output signal, data_out, to the controller unit 140.

Figure 5:
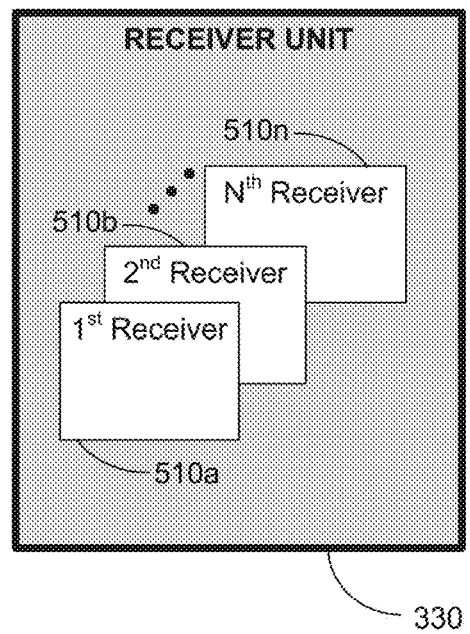
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a $1^{st}$ receiver 510a, a $2^{nd}$ receiver 510b, through an $N^{th}$ receiver 510n (collectively "510"). In one embodiment, the $1^{st}$ through $N^{th}$ receivers 510 may each process a single signal from the signal generation unit 310 and provide the signal to the controller unit 140. In another embodiment, the may provide a plurality of signals to the through $N^{th}$ receiver 510. For example, the antenna unit 130 may provide a signal to each receiver 510, or alternatively, a $1^{st}$ receiver signal for a first set of receivers 510, and a $2^{nd}$ receiver signal for a second set of receivers 510.

Figure 6:
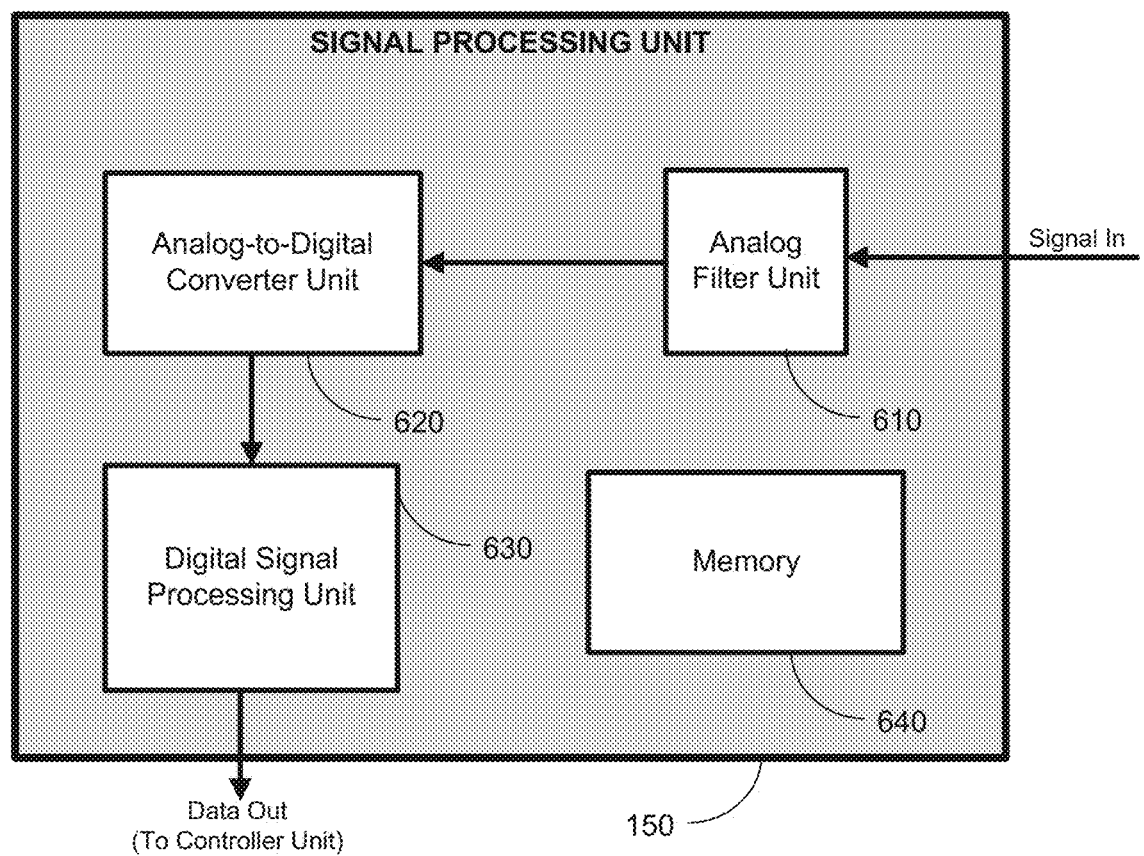
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as Fast Fourier Transform (FFT), may be performed on the mm-wave signal. The processed digital output from the DSP unit 630 may be sent to the controller unit 140 for analysis. In other instances, the digital output may be buffered or stored into a memory 640. In some cases, the memory 610 may be a first-in-first-out (FIFO) memory. In other cases, the processed digital output from the DSP unit 630 may be stored in the memory unit 210 of the controller unit 140.

Figure 7:
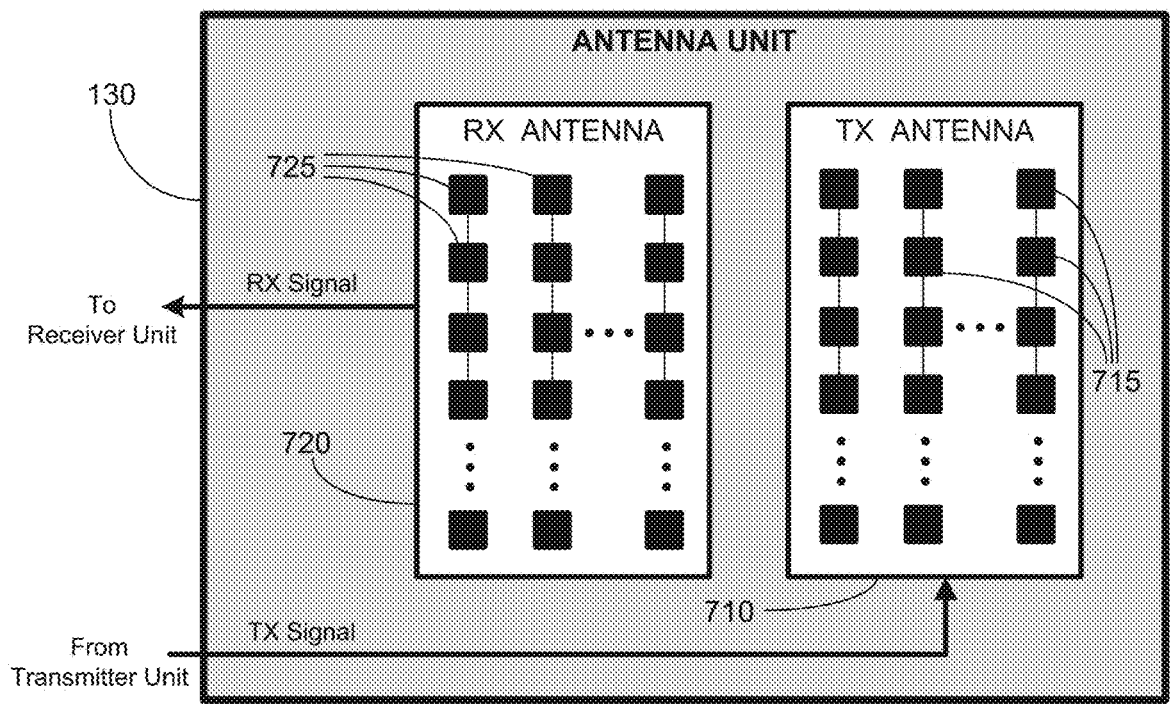
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
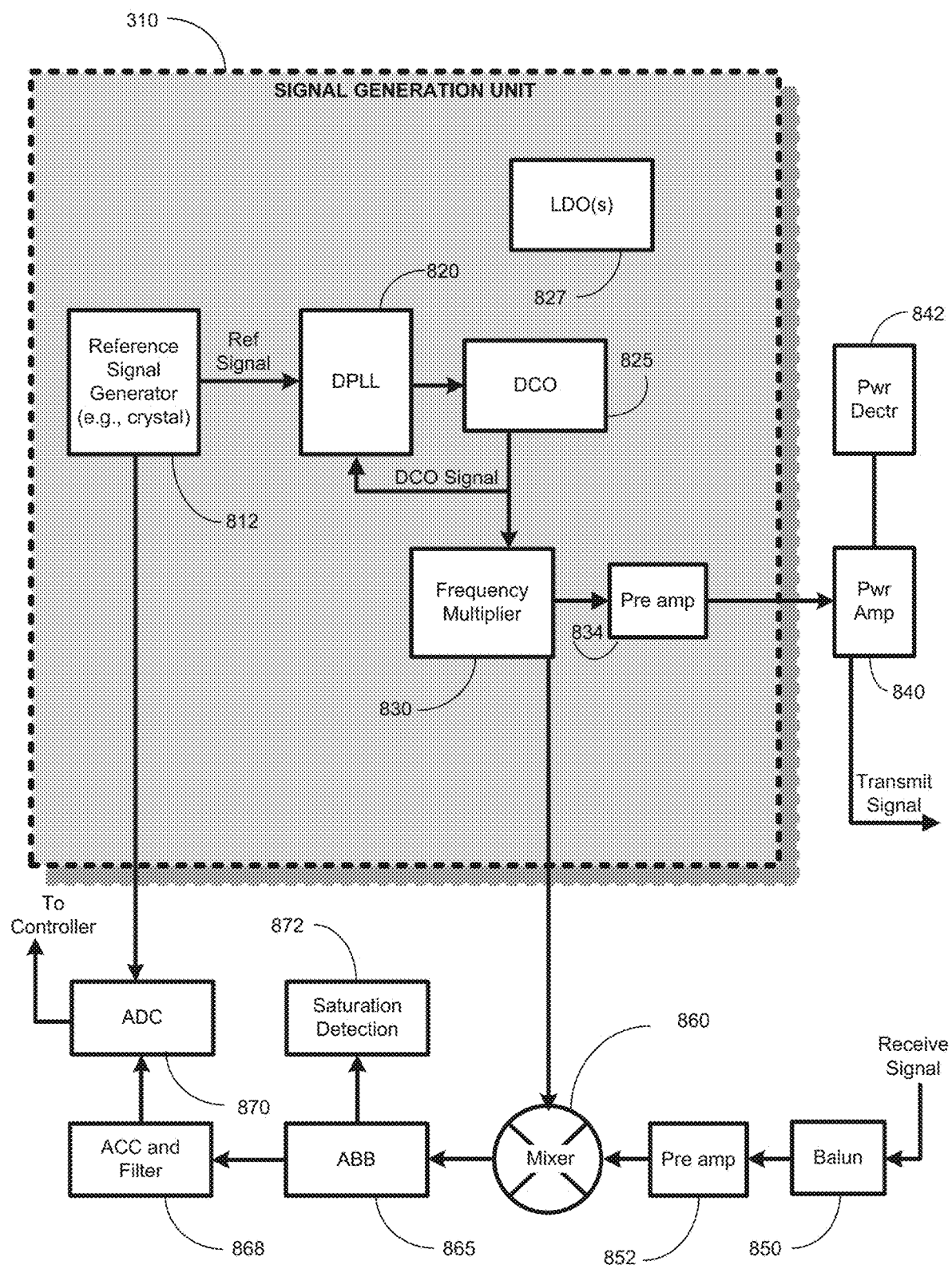
FIG. 8 illustrates a stylized block diagram depiction of an exemplary radar application of the system of FIG. 1, in accordance with embodiments herein.

Turning now to FIG. 8, a stylized block diagram depiction of an exemplary communication application of the system 100, in accordance with embodiments herein is illustrated. FIG. 8 shows an exemplary implementation of the signal generation unit 310 (FIG. 3) and exemplary portions of the transmitter unit 320 and the receiver unit 330.

The signal generation unit 310 generates a signal (e.g., a first communication signal) that is to be transmitted. A reference signal is provided by a reference signal generator 812. The reference signal is sent to a digital phase lock loop (DPLL) 820. The DPLL 820 locks the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 20 GHz.

Those skilled in the art having benefit of the present disclosure would appreciate that in the example of a radar system, the signal generation unit 310 may also include a frequency modulated continuous wave (FMCW) generator to provide an mm wave signal in the range of about 20 GHZ.

A plurality of low dropout (LDO) regulators 827, which may comprise a reference voltage, an error amplifier, a feedback voltage divider, and a plurality of pass elements, e.g., transistors. The LDO regulators 827 are configured to provide a regulated voltage supply to the various portions of the circuit of FIG. 8. Generally, this regulated voltage supply is lower than the supply voltage.

In some embodiments, it is desirable to transmit a 28 GHz or an about 40 GHz signal, for example in a communication application. The DCO 825 may provide a 14 GHz signal, therefore, frequency multiplying may be required to provide a 28 GHz or an about 40 GHz signal to transmit. Accordingly, a frequency multiplier 830 may be used to multiply the frequency provided by the DCO 825 to yield the desired output frequency, provided to pre amp 834, and subsequently provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal.

A received signal may be processed by the circuit shown in FIG. 8. The received signal, e.g., from the signal processing unit 150, is provided to a balun circuit 850. The balun circuit 850 may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from the frequency multiplier 830. The output of the frequency multiplier 830 may be a reference signal having a desired reference frequency. The mixer 860 receives the reference signal and in one embodiment, multiplies it to the received communication signal.

In one embodiment, the frequency multiplier 830 may be a fully differential push-push frequency doubler.

The output of the mixer 860 is provided to an ABB 865. The output of the ABB 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions.

Figure 9:
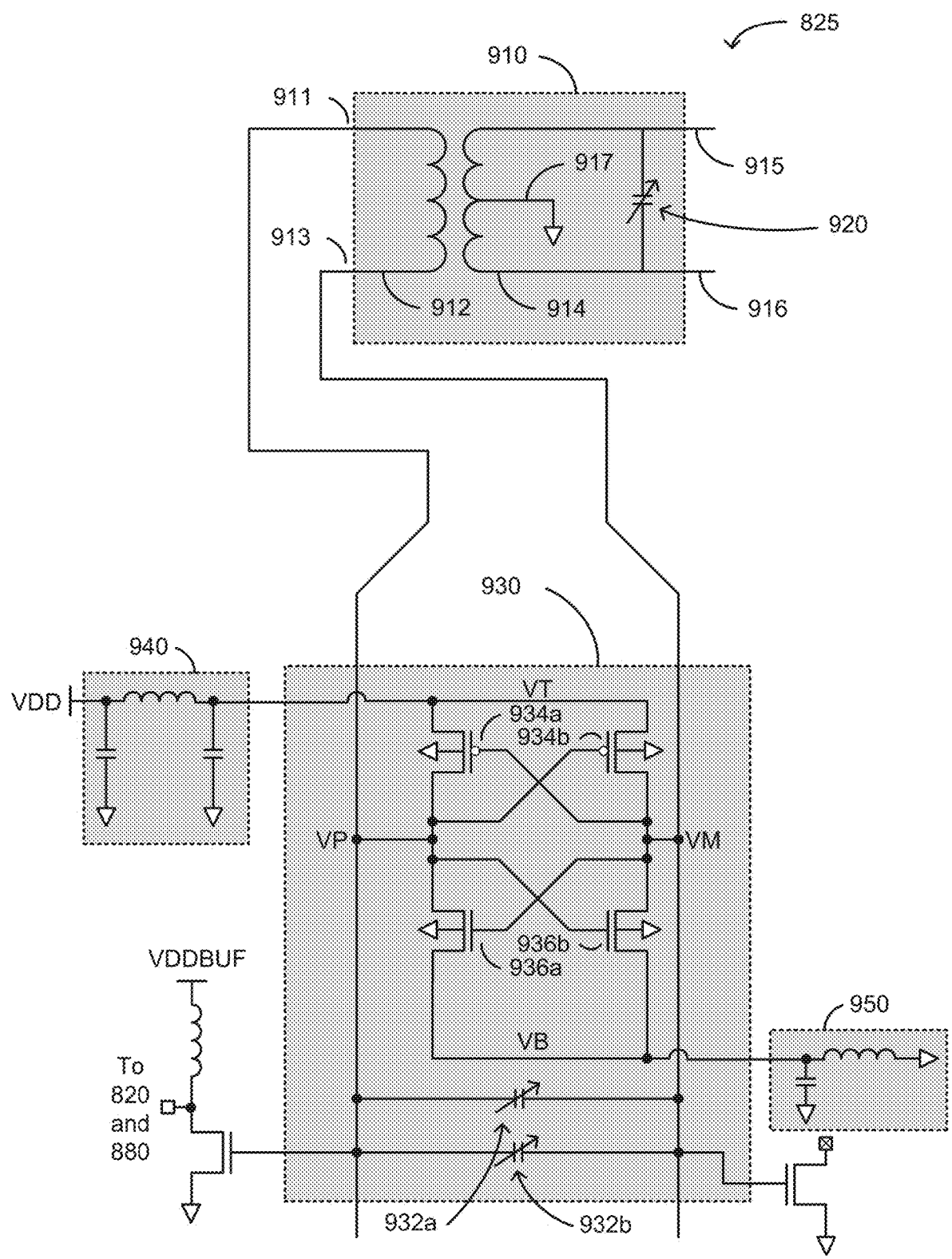
FIG. 9 illustrates a digitally controlled oscillator (DCO), in accordance with embodiments herein.

Turning to FIG. 9, a DCO 825 in accordance with embodiments herein is schematically depicted. The DCO 825 comprises a transformer 910. The transformer 910 comprises a primary winding 912 and a secondary winding 914.

The secondary winding 914 comprises a first port 915, a second port 916, and an array of capacitor units 920.

Figure 10:
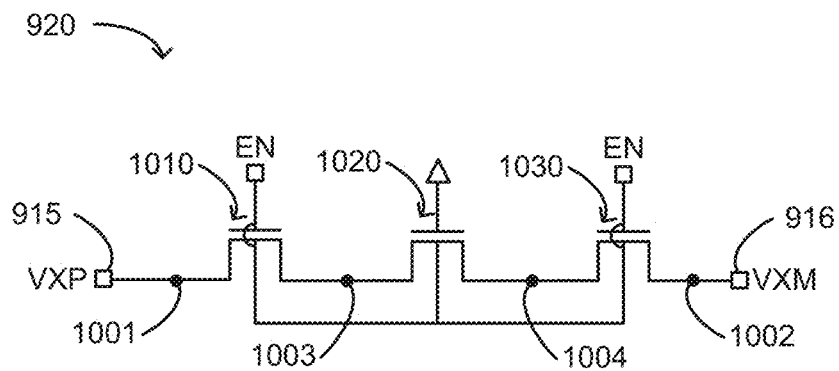
FIG. 10 illustrates a capacitor unit, in accordance with embodiments herein.

Referring simultaneously to FIGS. 9 and 10, one exemplary capacitor unit 920 is shown in detail in FIG. 10. The capacitor unit 920 comprises three NFET transistors 1010, 1020, and 1030. The first NFET 1010 has a gate and a back gate connected to a control signal (EN). In one embodiment, the control signal EN is switchable to provide a control signal of 0 V (off) or a control signal of 0.8 V (on). The first NFET 1010 also comprises a drain connected to the first port 915 of the secondary winding 914.

The second NFET 1020 has a gate connected to ground. In other words, the second NFET 1020 is always in the off state and is in a DC open condition. The back gate of the second NFET 1020 is connected to the control signal (EN). The drain of the second NFET 1020 is connected to the source of the first NFET 1010.

The third NFET 1030 has a gate and a back gate connected to the control signal (EN), a drain connected to the source of the second NFET 1040, and a source connected to the second port 916 of the secondary winding 914.

Although it comprises three NFETs 1010, 1020, and 1030, variable capacitances arise between components of the capacitor unit 920 depending on whether the first and third NFETs 1010 and 1030 are in the on-state or the off-state.

When the first and third NFETs 1010 and 1030 are in the off-state, i.e., when EN is 0 V, there exists a capacitance $C_a$ between the first port 915 and the drain of the first NFET 1010 (i.e., at location 1001) such that $C_a = C_{par} + C_{ov} + C_{sb}$, wherein $C_{par}$ is a capacitance arising from metal routing, $C_{ov}$ is $C_{gsloff}$, or about $0.5 \ast C_{gs}$ (the gate to source capacitance of one NFET when its gate is biased high and its source and drain are biased low, e.g., when the NFET is on_, and $C_{sb}$ is the source to back gate capacitance of one NFET (which is independent of bias). The same capacitance $C_a$ also exists between the source of the third NFET 1030 and the second port 916 (i.e., at location 1002).

Also when the first and third NFETs 1010 and 1030 are in the off-state, there exists between the source of the first NFET 1010 and the drain of the second NFET 1020 (i.e., at location 1003) a capacitance $C_b$, such that $C_b = 2 \ast C_{ov} + C_{sb}$. The same capacitance $C_b$ also exists between the source of the second NFET 1020 and the drain of the third NFET 1030 (i.e., at location 1004).

Additionally when the first and third NFETs 1010 and 1030 are in the off-state, there exists a capacitance $C_c$ between location 1001 and location 1003 (i.e., at the first NFET 1010) such that $C_c = C_{ds}$ wherein $C_{ds}$ is the parasitic capacitance between the source and drain of one NFET due to metal routing, which occurs when the NFET is off. The same capacitance $C_c$ also exists between locations 1003 and 1004 (i.e., at the second NFET 1020) and between locations 1004 and 1002 (i.e., at the third NFET 1030).

Overall, when the first and third NFETs 1010 and 1030 are in the off-state, the off-state capacitance of the capacitor unit 920 is about $0.5 \ast (C_{par} + C_{ov} + C_{sb} + C_{ds})$.

When an enabling signal is applied to the gates of the first and third NFETs 1010 and 1030, such that the first and third NFETs 1010 and 1030 are in the on-state, the capacitances $C_a$ and $C_b$ change. The on-state capacitance of $C_a$ is $C_{par} + C_{gs} + C_{sb}$. The on-state capacitance of $C_b$ is $C_{gs} + C_{sb} + C_{ov}$. The on-state capacitance of $C_c$ does not change.

Overall, when the first and third NFETs 1010 and 1030 are in the on-state, the on-state capacitance of the capacitor unit 920 is about $0.5 \ast (C_{par} + 5 \ast C_{ov} + 2 \ast C_{sb} + 2 \ast C_{ds})$.

Accordingly, the total change in capacitance of the capacitor unit 920 when going from the off-state to the on-state of the first and third NFETs 1010 and 1030 is about $2 \ast C_{ov} + 0.5 \ast (C_{sb} + C_{ds})$. In embodiments wherein the enabling signal is about 0.8 V, the difference between the on-state capacitance and the off-state capacitance may be from about 50 aF to about 500 aF. In one embodiment, the difference is from about 150 aF to about 200 aF.

Figure 11:
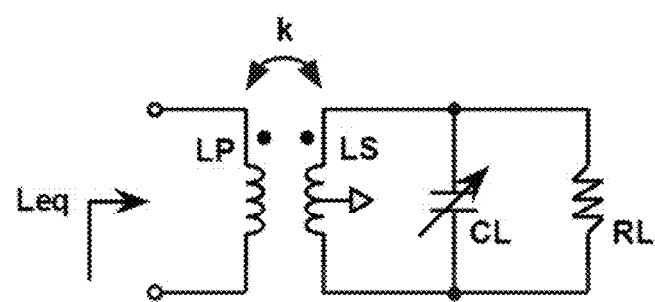
FIG. 11 illustrates an L-tune circuit, in accordance with embodiments herein.

Changing the capacitance of the capacitor unit 920 between the off-state and the on-state allows fine tuning of the output frequency of the DCO 825 by a fine tuning resolution. The person of ordinary skill in the art will be aware of the L-tune circuit and the corresponding L-tune equation shown in FIG. 11. Generally, and though not to be bound by theory, changing the capacitance of the capacitor unit 920 in the secondary winding 914 may vary the primary inductance value of the transformer 910.

Accordingly, the output frequency of the DCO 825 may have a fine tuning range equal to the fine tuning resolution of one capacitor unit 920 times the number of capacitor units 920 in the secondary winding 914. For example, when the DCO has an output frequency of about 20 GHz, the output frequency may have a fine tuning resolution from about 0.1 MHz to about 1 MHz, and the output frequency has a fine tuning range from about 0.1 MHz times the number of capacitor units to about 1 MHz times the number of capacitor units. In one embodiment, wherein the on-state/off-state capacitance difference of the capacitor unit 920 is from about 150 aF to about 200 aF, the fine tuning resolution is about 0.3 MHz, and the fine tuning range is about 0.3 MHz times the number of capacitor units 920.

The number of capacitor units 920 may be varied as desired based on the overall fine tuning range desired for a particular application of the mm-wave device 100, as well as other concerns (e.g., manufacturing cost, ease of use, etc.) that will be apparent to the person of ordinary skill in the art having the benefit of the present disclosure. In one embodiment, the number of capacitor units 920 may be a power of 2, e.g., 2, 4, 8, 16, 32, 64, 128, 256, 512, 1024, etc. In one embodiment, the DCO 825 comprises 256 capacitor units 920.

In one particular embodiment, the fine tuning resolution is about 0.3 MHz, and the fine tuning range is about 80 MHz, such as from 74 MHz to 84 MHz.

Continuing referring to FIG. 9, the DCO 825 may comprise one or more additional features as depicted. In one embodiment, the secondary winding 914 further comprises a center tap 917, wherein the center tap 917, in one embodiment, may be electrically connected to ground. Grounding the center tap 917 may bias the inputs to the capacitor unit 920 from the first port 915 and the second port 916 to 0 V DC. In some alternative embodiments, a predetermined voltage may be applied to the center tap 917 to further adjust the biasing of the inputs to the capacitor unit 920.

The transformer 910 further comprises a primary winding 912. In one embodiment, as depicted in FIG. 9, the DCO 825 further comprises a main LC circuit 930 connected to a first port 911 and a second port 913 of the primary winding 912.

The main LC circuit 930 may comprise at least one switched capacitor 932. For example, as depicted, the main LC circuit 930 may comprise two switched capacitors 932a and 932b. In other embodiments, not depicted, the main LC circuit 930 may comprise a different number of switched capacitor(s) 932.

By switching the switched capacitor(s) 932 on or off, the switched capacitor(s) 932 may allow coarse or gross tuning of the output frequency of the DCO 825. The coarse tuning resolution may be less than the fine tuning range, e.g., if the fine tuning range is about 80 MHz, the coarse tuning resolution may be less than 80 MHz. The coarse tuning range may be equal to the coarse tuning resolution times the number of switched capacitor(s) 932.

In the particular embodiment of the DCO 825 depicted in FIG. 9, the main LC circuit 930 comprises a cross-coupled pair of PFETs comprising a first PFET 934a and a second PFET 934b. The main LC circuit 930 also comprises a cross-coupled pair of NFETs comprising a first NFET 936a and a second NFET 936b. As depicted in FIG. 9, the drain of the first PFET 934a and the source of the first NFET 936a may be connected to the first port 911 of the primary winding 912, and the drain of the second PFET 934b and the source of the second NFET 936b may be connected to the second port 913 of the primary winding 912.

Alternatively or in addition, as depicted in FIG. 9, the DCO 825 may further comprise a first 2nd-harmonic LC circuit 940 receiving a VDD signal. The sources of the first PFET 934a and the second PFET 934b may be connected to the output of the first 2nd-harmonic LC circuit 940. Alternatively or in addition, the DCO 825 may further comprise a second 2nd-harmonic LC circuit 950 connected to the sources of the first NFET 936a and the second NFET 936b, wherein the output of the second 2nd-harmonic LC circuit 950 is provided to ground.

Figure 12:
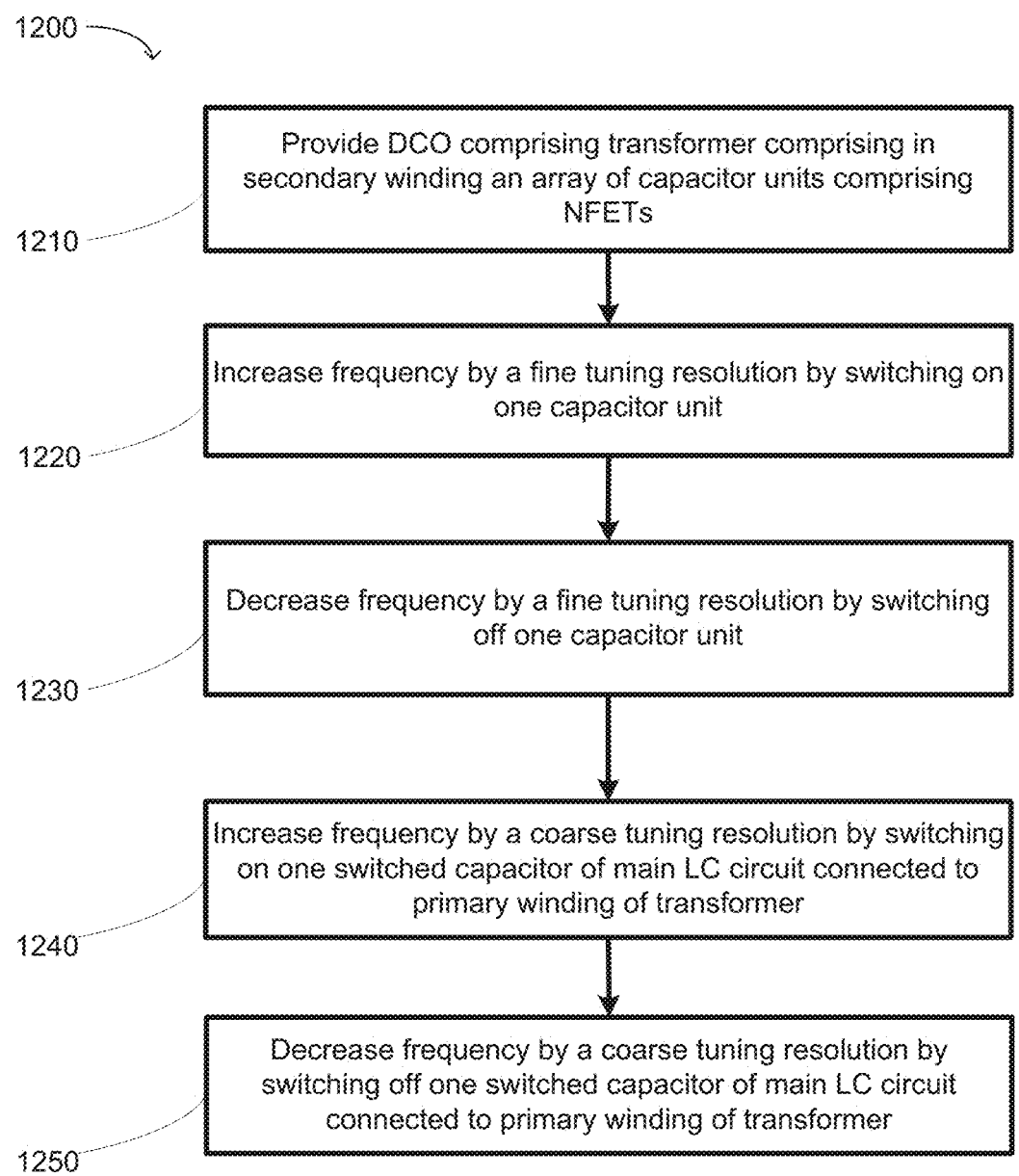
FIG. 12 illustrates a flowchart of a method, in accordance with embodiments herein.

Turning now to FIG. 12, a flowchart of a method 1200 is presented. The method 1200 comprises providing (at 1210) a digitally controlled oscillator (DCO) comprising a transformer, the transformer comprising a primary winding and a secondary winding, the secondary winding comprising a first port, a second port, and an array of capacitor units, wherein each capacitor unit comprises a first NFET having a gate and a back gate connected to a control signal, and a drain connected to the first port of the secondary winding; a second NFET having a gate connected to ground, a back gate connected to the control signal, and a drain connected to the source of the first NFET; and a third NFET having a gate and a back gate connected to the control signal, a drain connected to the source of the second NFET, and a source connected to the second port of the secondary winding. In one embodiment, the DCO may be the DCO 825 depicted in FIG. 9, and the capacitor unit may be the capacitor unit 920 depicted in FIG. 10. In a further embodiment, the array of capacitor units comprises 256 capacitor units.

The method 1200 also comprises increasing (at 1220) the frequency of the DCO by a fine tuning resolution by switching on one capacitor unit and decreasing (at 1230) the frequency of the DCO by the fine tuning resolution by switching off one capacitor unit. In one embodiment, wherein the fine tuning resolution is about 0.3 MHz when the DCO frequency is about 20 GHz.

In one embodiment, each capacitor unit has an off-state capacitance when switched off and an on-state capacitance when switched on, wherein the difference between the on-state capacitance and the off-state capacitance is from about 50 aF to about 500 aF. In a more particular embodiment, the difference is from about 150 aF to about 200 aF.

The DCO provided (at 1210) may further comprise a main LC circuit connected to a first port of the primary winding and a second port of the primary winding, wherein the main LC circuit comprises at least one switched capacitor. In such embodiments, the method 1200 may further comprise increasing (at 1240) the frequency of the DCO by a coarse tuning resolution by switching on one switched capacitor of the main LC circuit and decreasing (at 1250) the frequency of the DCO by the coarse tuning resolution by switching off one switched capacitor of the main LC circuit.

Figure 13:
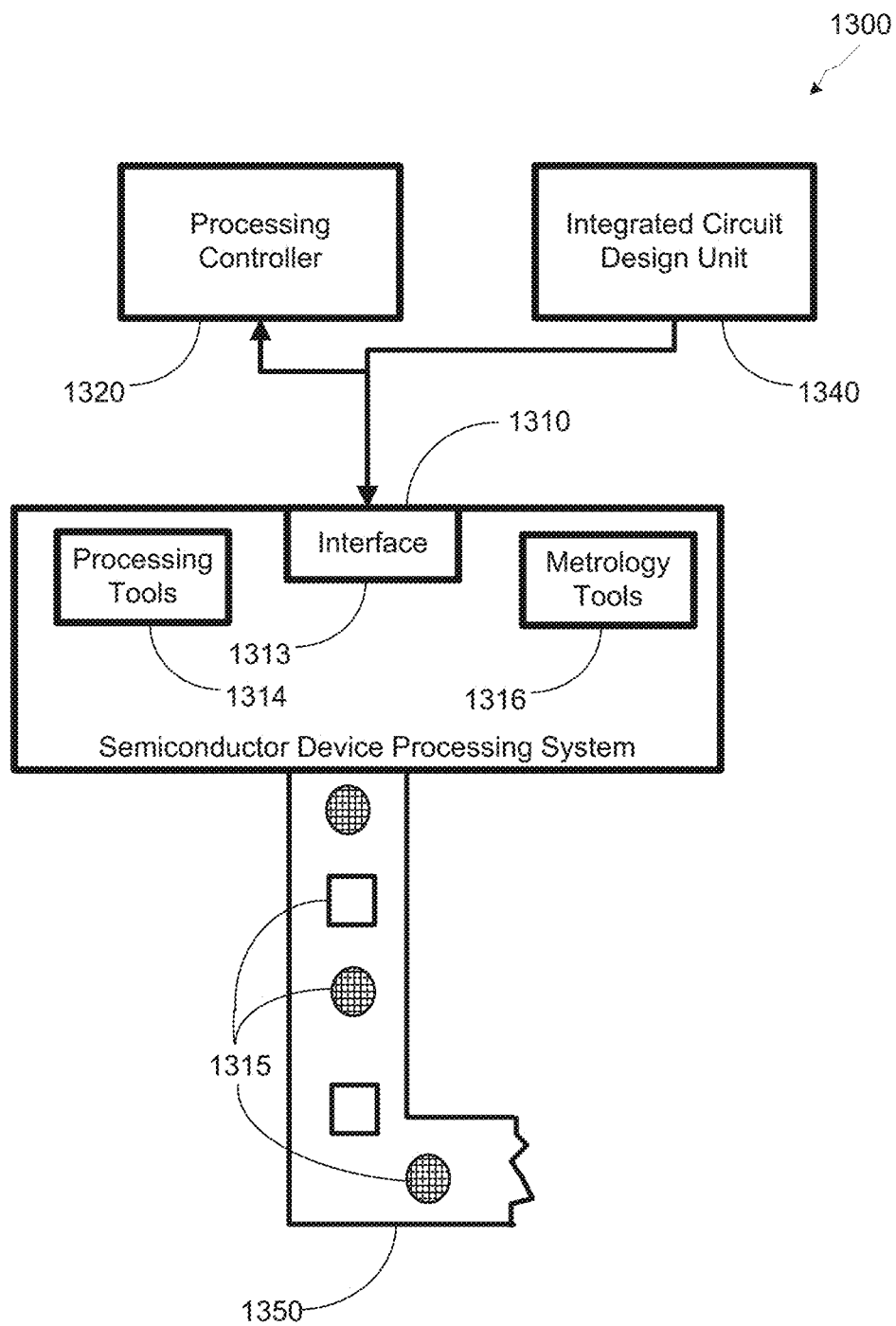
FIG. 13 illustrates a stylized depiction of a system for fabricating a semiconductor device, in accordance with embodiments herein.

Turning now to FIG. 13, a stylized depiction of a system 1300 for fabricating a semiconductor device package having a local oscillator distribution circuitry 800, in accordance with embodiments herein, is illustrated. A system 1300 of FIG. 13 may comprise a semiconductor device processing system 1310 and an integrated circuit design unit 1340. The semiconductor device processing system 1310 may manufacture integrated circuit devices based upon one or more designs provided by the integrated circuit design unit 1340.

The semiconductor device processing system 1310 may comprise various processing stations, such as etch process stations, photolithography process stations, CMP process stations, etc. Each of the processing stations may comprise one or more processing tools 1314 and or metrology tools 1316. Feedback based on data from the metrology tools 1316 may be used to modify one or more process parameters used by the processing tools 1314 for performing process steps.

The semiconductor device processing system 1310 may also comprise an interface 1312 that is capable of providing communications between the processing tools 1314, the metrology tools 1316, and a controller, such as the processing controller 1320. One or more of the processing steps performed by the semiconductor device processing system 1310 may be controlled by the processing controller 1320. The processing controller 1320 may be a workstation computer, a desktop computer, a laptop computer, a tablet computer, or any other type of computing device having one or more software products that are capable of controlling processes, receiving process feedback, receiving test results data, performing learning cycle adjustments, performing process adjustments, etc.

The semiconductor device processing system 1310 may produce integrated circuits (e.g., semiconductor devices comprising a DCO 825) on a medium, such as silicon wafers. More particularly, in one embodiment, the semiconductor device processing system 1310 may produce form a capacitor unit, comprising a first NFET having a gate and a back gate connected to a control signal, and a drain connected to a first voltage source; a second NFET having a gate connected to ground, a back gate connected to the control signal, and a drain connected to the source of the first NFET; and a third NFET having a gate and a back gate connected to the control signal, a drain connected to the source of the second NFET, and a source connected to a second voltage source.

In one embodiment, the semiconductor device processing system 1310 may be further adapted to form a digitally controlled oscillator (DCO) comprising a transformer, the transformer comprising a secondary winding which comprises a first port, a second port, and an array comprising a plurality of the capacitor units. In a further embodiment, the semiconductor device processing system 1310 may be further adapted to form the transformer such that the transformer further comprises a primary winding, and the DCO further comprises a main LC circuit connected to a first port of the primary winding and a second port of the primary winding, and comprising at least one switched capacitor.

In another further embodiment, the semiconductor device processing system 1310 may be further adapted to form in the main LC circuit a cross-coupled pair of PFETs comprising a first PFET and a second PFET, and a cross-coupled pair of NFETs comprising a first NFET and a second NFET, wherein a drain of the first PFET and a source of the first NFET are connected to the first port of the primary winding and a drain of the second PFET and a source of the second NFET are connected to the second port of the primary winding. In yet a further embodiment, the semiconductor device processing system 1310 may be further adapted to form in the DCO a first 2nd-harmonic LC circuit receiving a VDD signal, wherein the sources of the first PFET and the second PFET are connected to the output of the first 2nd-harmonic LC circuit; and a second 2nd-harmonic LC circuit receiving a signal from the sources of the first NFET and the second NFET, wherein the output of the second 2nd-harmonic LC circuit is provided to ground.

Alternatively or in addition, the semiconductor device processing system 1310 may be further adapted to form the DCO such that the DCO has an output frequency of about 20 GHz, the output frequency has a fine tuning resolution from about 0.1 MHz to about 1 MHz, and the output frequency has a fine tuning range from about 0.1 MHz times the number of capacitor units to about 1 MHz times the number of capacitor units. In a more particular embodiment, the semiconductor device processing system 1310 may be further adapted to form the DCO such that the fine tuning resolution is about 0.3 MHz, and the fine tuning range is about 0.3 MHz times the number of capacitor units.

In one embodiment, the semiconductor device processing system 1310 may be further adapted to form a control signal source configured to provide the control signal, wherein the control signal is switchable to provide a control signal of 0 V or a control signal of 0.8 V. In a further embodiment, the semiconductor device processing system 1310 may be further adapted to form the capacitor unit such that the capacitor unit has an off-state capacitance when the control signal is 0 V and an on-state capacitance when the control signal is 0.8 V, wherein the difference between the on-state capacitance and the off-state capacitance is from about 50 aF to about 500 aF. In a more particular embodiment, the semiconductor device processing system 1310 may be further adapted to form the capacitor unit such that the difference is from about 150 aF to about 200 aF.

The production of integrated circuits by the semiconductor device processing system 1310 may be based upon the circuit designs provided by the integrated circuit design unit 1340. The semiconductor device processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may comprise a plurality of processing steps, e.g., the $1^{st}$ process step, the $2^{nd}$ process step, etc., as described above.

In some embodiments, the items labeled "1315" may represent individual wafers, and in other embodiments, the items 1315 may represent a group of semiconductor wafers, e.g., a "lot" of semiconductor wafers. The integrated circuit or device 1315 may comprise a transistor, a capacitor, a resistor, a memory cell, a processor, and/or the like.

The integrated circuit design unit 1340 of the system 1300 is capable of providing a circuit design that may be manufactured by the semiconductor device processing system 1310. This may include information regarding the components of the DCO 825 and/or the capacitor unit 920 described above.

The integrated circuit design unit 1340 may be capable of determining the number of devices (e.g., processors, memory devices, etc.) to place in a device package. Based upon such details of the devices, the integrated circuit design unit 1340 may determine specifications of the devices that are to be manufactured. Based upon these specifications, the integrated circuit design unit 1340 may provide data for manufacturing a semiconductor device package described herein.

The system 1300 may be capable of performing analysis and manufacturing of various products involving various technologies. For example, the system 1300 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1300 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A digitally controlled oscillator (DCO), comprising:
a transformer, comprising:
a secondary winding comprising a first port, a second port, and an array of capacitor units, wherein each capacitor unit comprises:
a first NFET having a gate and a back gate connected to a control signal, and a drain connected to the first port of the secondary winding;
a second NFET having a gate connected to ground, a back gate connected to the control signal, and a drain connected to the source of the first NFET; and
a third NFET having a gate and a back gate connected to the control signal, a drain connected to the source of the second NFET, and a source connected to the second port of the secondary winding.

2. The DCO of claim 1, wherein the secondary winding further comprises a center tap, wherein the center tap is electrically connected to ground.

3. The DCO of claim 1, wherein the transformer further comprises a primary winding, and the DCO further comprises a main LC circuit connected to a first port of the primary winding and a second port of the primary winding, and comprising at least one switched capacitor.

4. The DCO of claim 3, wherein the main LC circuit comprises a cross-coupled pair of PFETs comprising a first PFET and a second PFET, and a cross-coupled pair of NFETs comprising a first NFET and a second NFET, wherein a drain of the first PFET and a source of the first NFET are connected to the first port of the primary winding and a drain of the second PFET and a source of the second NFET are connected to the second port of the primary winding.

5. The DCO of claim 4, further comprising
a first 2nd-harmonic LC circuit receiving a VDD signal, wherein the sources of the first PFET and the second PFET are connected to the output of the first 2nd-harmonic LC circuit; and
a second 2nd-harmonic LC circuit connected to the sources of the first NFET and the second NFET, wherein the output of the second 2nd-harmonic LC circuit is provided to ground.

6. The DCO of claim 1, wherein each capacitor unit has an off-state capacitance when the control signal is 0 V and an on-state capacitance when the control signal is greater than 0 V, wherein the difference between the on-state capacitance and the off-state capacitance is from about 50 aF to about 500 aF.

7. The DCO of claim 6, wherein the DCO has an output frequency of about 20 GHz, wherein the output frequency has a fine tuning resolution from about 0.1 MHz to about 1 MHz, and the output frequency has a fine tuning range from about 0.1 MHz times the number of capacitor units to about 1 MHz times the number of capacitor units.

8. The DCO of claim 7, wherein the difference is from about 150 aF to about 200 aF, the fine tuning resolution is about 0.3 MHz, and the fine tuning range is about 0.3 MHz times the number of capacitor units.

9. A capacitor unit, comprising:
a first NFET having a gate and a back gate connected to a control signal, and a drain connected to a first voltage source;
a second NFET having a gate connected to ground, a back gate connected to the control signal, and a drain connected to the source of the first NFET; and
a third NFET having a gate and a back gate connected to the control signal, a drain connected to the source of the second NFET, and a source connected to a second voltage source.

10. The capacitor unit of claim 9, wherein the control signal is switchable to provide a control signal of 0 V or a control signal of 0.8 V.

11. The capacitor unit of claim 10, wherein the capacitor unit has an off-state capacitance when the control signal is 0 V and an on-state capacitance when the control signal is 0.8 V.

12. The capacitor unit of claim 10, wherein the difference between the on-state capacitance and the off-state capacitance is from about 50 aF to about 500 aF.

13. The capacitor unit of claim 12, wherein the difference is from about 150 aF to about 200 aF.

14. A method, comprising:
providing a digitally controlled oscillator (DCO) comprising a transformer, the transformer comprising a primary winding and a secondary winding, the secondary winding comprising a first port, a second port, and an array of capacitor units, wherein each capacitor unit comprises a first NFET having a gate and a back gate connected to a control signal, and a drain connected to the first port of the secondary winding; a second NFET having a gate connected to ground, a back gate connected to the control signal, and a drain connected to the source of the first NFET; and a third NFET having a gate and a back gate connected to the control signal, a drain connected to the source of the second NFET, and a source connected to the second port of the secondary winding;
increasing the frequency of the DCO by a fine tuning resolution by switching on one capacitor unit; and
decreasing the frequency of the DCO by the fine tuning resolution by switching off one capacitor unit.

15. The method of claim 14, wherein each capacitor unit has an off-state capacitance when switched off and an on-state capacitance when switched on, wherein the difference between the on-state capacitance and the off-state capacitance is from about 50 aF to about 500 aF.

16. The method of claim 15, wherein the difference is from about 150 aF to about 200 aF.

17. The method of claim 16, wherein the fine tuning resolution is about 0.3 MHz when the DCO frequency is about 20 GHz.

18. The method of claim 17, wherein the array of capacitor units comprises 256 capacitor units.

19. The method of claim 14, wherein the DCO further comprises a main LC circuit connected to a first port of the primary winding and a second port of the primary winding, wherein the main LC circuit comprises at least one switched capacitor, and the method further comprises increasing the frequency of the DCO by a coarse tuning resolution by switching on one switched capacitor of the main LC circuit.

20. The method of claim 14, wherein the DCO further comprises a main LC circuit connected to a first port of the primary winding and a second port of the primary winding, wherein the main LC circuit comprises at least one switched capacitor, and the method further comprises decreasing the frequency of the DCO by the coarse tuning resolution by switching off one switched capacitor of the main LC circuit.

* * * * *